(12) United States Patent
Hamao et al.

(10) Patent No.: US 8,327,997 B2
(45) Date of Patent: Dec. 11, 2012

(54) TRANSFERRED OBJECT ROTATING DEVICE

(75) Inventors: Tamotsu Hamao, Kyoto (JP); Akira Tanaka, Osaka (JP); Eiji Kawata, Taito-ku (JP); Shuichi Akashi, Taito-ku (JP); Hiroyuki Kuroki, Taito-ku (JP)

(73) Assignees: Otsuka Electronics Co., Ltd., Hirakata-Shi (JP); Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 13/188,443

(22) Filed: Jul. 21, 2011

(65) Prior Publication Data

US 2012/0018280 A1    Jan. 26, 2012

(30) Foreign Application Priority Data

Jul. 21, 2010  (JP) ................................. 2010-163991

(51) Int. Cl.
 *B65G 47/86* (2006.01)
(52) U.S. Cl. ........ 198/379; 198/406; 198/412; 198/413; 198/414
(58) Field of Classification Search .................. 198/375, 198/379, 406, 412, 413, 414, 416
See application file for complete search history.

(56) References Cited

U.S. PATENT DOCUMENTS

| | | | | |
|---|---|---|---|---|
| 2,907,442 A * | 10/1959 | Monje | ........................... | 198/379 |
| 4,217,977 A * | 8/1980 | Tam | ......................... | 198/341.07 |
| 4,457,419 A * | 7/1984 | Ogami et al. | .............. | 198/345.1 |
| 4,558,984 A * | 12/1985 | Garrett | ........................... | 414/609 |
| 4,695,215 A * | 9/1987 | Jacoby et al. | ............. | 414/223.01 |
| 5,141,095 A * | 8/1992 | Kamp | ............................ | 198/409 |
| 5,238,354 A * | 8/1993 | Volovich | ........................ | 414/779 |
| 5,450,940 A * | 9/1995 | Rathert et al. | ................. | 198/412 |
| 5,479,108 A * | 12/1995 | Cheng | ....................... | 324/750.19 |
| 5,511,934 A * | 4/1996 | Bacchi et al. | .................. | 414/783 |
| 6,114,705 A * | 9/2000 | Leavitt et al. | ............ | 250/442.11 |
| 6,343,686 B1 * | 2/2002 | Whiting et al. | ................ | 198/379 |
| 6,614,220 B2 * | 9/2003 | Mang et al. | .............. | 324/757.02 |
| 8,061,500 B2 * | 11/2011 | Baccini | ...................... | 198/345.1 |

FOREIGN PATENT DOCUMENTS

| | | |
|---|---|---|
| JP | 61-017742 U | 2/1986 |
| JP | 61-231738 | 10/1986 |
| JP | 02-132950 U | 11/1990 |
| JP | 05-116753 | 5/1993 |
| JP | 05-074741 U | 10/1993 |
| JP | 2000-176769 | 6/2000 |

* cited by examiner

*Primary Examiner* — Douglas Hess
(74) *Attorney, Agent, or Firm* — Ditthavong Mori & Steiner, P.C.

(57) ABSTRACT

A transferred object rotating device includes a mounting plate having an opening corresponding to a shape of a transferred object and being capable of moving from a mounting position to a rotating position, a boost unit capable of moving up to pass through the opening of the mounting plate in the rotating position, and a rotation plate capable of rotating about a power transmission shaft. The mounting plate moves to the rotating position after the transferred object is mounted on the mounting plate to close the opening. The transferred object is lifted by upward movement of the boost unit. The transferred object rotates while being sandwiched between the boost unit and the rotation plate. The transferred object mounted on the mounting plate in the mounting position can be transferred to the rotating position by the mounting plate, and rotate in the rotating position.

9 Claims, 11 Drawing Sheets

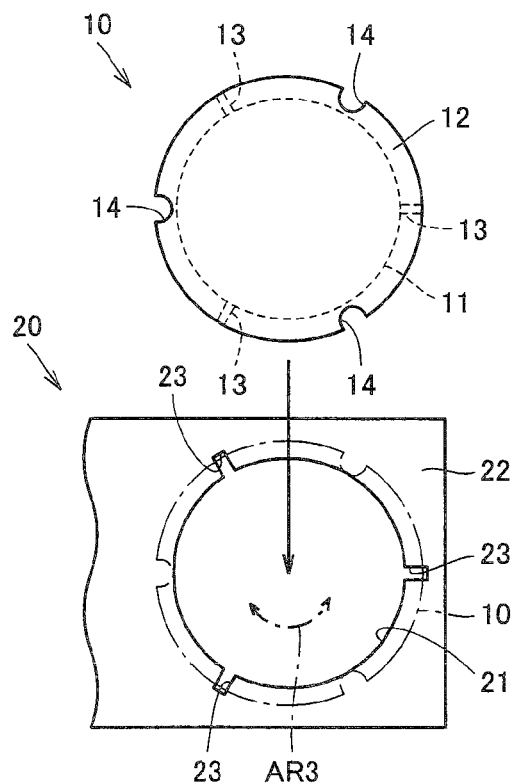
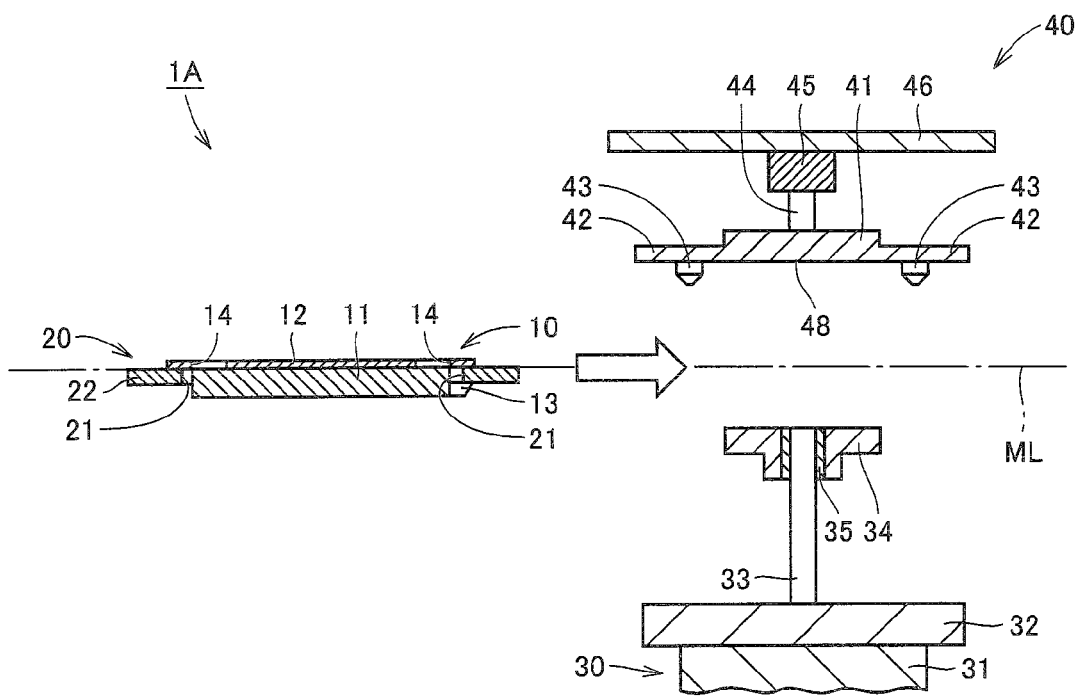

TRANSFERRED OBJECT ROTATING DEVICE

BACKGROUND OF THE INVENTION

1. Field of the Invention

The present invention relates to a transferred object rotating device for transferring a transferred object from a mounting position to a rotating position, and rotating the transferred object in the rotating position.

2. Description of the Background Art

Japanese Patent Laying-Open No. 05-116753 discloses a technique of transferring a workpiece mounted on a carrier to a compression bonding and pressing step. Japanese Patent Laying-Open No. 61-231738 discloses a technique regarding a wafer holding mechanism for supplying and discharging a wafer to a wafer chuck.

Japanese Utility Model Laying-Open No. 61-017742 discloses a wafer removal mechanism for removing a semiconductor wafer mounted on a tray from the tray. Japanese Utility Model Laying-Open No. 02-132950 discloses a technique in which a wafer is mounted on a susceptor fastened onto a rotary shaft capable of moving up and down, and the susceptor is lowered to a sample replacement chamber to replace the wafer.

Japanese Utility Model Laying-Open No. 05-074741 discloses a technique applied to a workpiece including a circular flange having a plurality of through holes at regular intervals in a circumferential direction, for positioning a rotation angle position of the workpiece based on the through holes. Japanese Patent Laying-Open No. 2000-176769 discloses a guide rod for positioning a workpiece from an outer circumferential direction.

SUMMARY OF THE INVENTION

As to a transferred object rotating device capable of performing operation of transferring a transferred object from a mounting position to a rotating position by a transfer unit after the transferred object is mounted on the transfer unit in the mounting position, and operation of rotating the transferred object in the rotating position, only the six documents mentioned above were found by research conducted by the applicants of the present application. None of the six documents, however, discloses a transferred object rotating device capable of such operations as described above.

A transferred object rotating device capable of such operations as described above may be suitably used for inspecting an outer surface of a transferred object (a shape of the outer surface of the transferred object, a broken condition of the outer surface of the transferred object or the like), for example. The outer surface of the transferred object that has been transferred to a rotating position is irradiated with inspection light. The transferred object rotates so that the entire outer surface is irradiated with the inspection light. The outer surface of the transferred object is inspected by analyzing a spectrum of reflected light from the outer surface and the like. Inspection efficiency is improved because it is unnecessary to rotationally move a device for emitting the inspection light and the like around the transferred object.

A transferred object rotating device capable of such operations as described above may also be suitably used for reading an information medium (an RFID (Radio Frequency Identification) tag, a bar code or the like) attached to an outer surface of a transferred object. As in the case of inspecting the outer surface, information reading efficiency is improved because it is unnecessary to rotationally move a device for reading the information medium on the outer surface and the like.

A transferred object rotating device capable of such operations as described above may further be suitably used for centrifuging a sample or the like filled in a transferred object. If a centrifugal separator is independently constructed, the transferred object filled with the sample or the like is subjected to prescribed processing, and needs to be mounted in a prescribed rotating position in the centrifugal separator by an operator. In contrast, according to a transferred object rotating device capable of such operations as described above, the transferred object that has been subjected to prescribed processing can be transferred from a mounting position to a rotating position without an operator, and then rotated.

The present invention was thus made in order to meet the demands as described above, and an object of the present invention is to provide a transferred object rotating device capable of performing operation of transferring a transferred object from a mounting position to a rotating position by a transfer unit after the transferred object is mounted on the transfer unit in the mounting position, and operation of rotating the transferred object in the rotating position.

A transferred object rotating device according to a first aspect of the present invention is a transferred object rotating device for rotating a transferred object, including a transfer part having an opening corresponding to a shape of the transferred object, and being capable of moving from a mounting position to a rotating position, a first up-and-down part positioned below the transfer part in the rotating position, and being capable of moving up to pass through the opening of the transfer part in the rotating position, and a rotation part positioned above the transfer part in the rotating position, and being capable of rotating about a rotary shaft. The transfer part moves to the rotating position after the transferred object is mounted on the transfer part to close the opening of the mounting position, and in the rotating position, the transferred object is lifted by upward movement of the first up-and-down part, and rotates with the first up-and-down part and the rotation part while being sandwiched between the first up-and-down part and the rotation part.

A transferred object rotating device according to a second aspect of the present invention is the transferred object rotating device according to the first aspect, in which the transferred object includes a first fit part and a second fit part, the transfer part includes a third fit part capable of fitting the first fit part when the transferred object is mounted on the transfer part, the rotation part includes a fourth fit part capable of fitting the second fit part while sandwiching the transferred object with the first up-and-down part, when the transferred object is mounted on the transfer part in the mounting position, the first fit part fits the third fit part, and a phase angle of the transferred object in a rotation direction is determined, and when the transferred object is lifted in the rotating position, the second fit part fits the fourth fit part, and the transferred object is sandwiched between the first up-and-down part and the rotation part with the phase angle in the rotation direction being maintained.

A transferred object rotating device according to a third aspect of the present invention is the transferred object rotating device according to the second aspect, in which the rotation part rotates with the transferred object such that the phase angle in the rotation direction is maintained before and after the rotation, when the first up-and-down part moves down in the rotating position, the first fit part fits the third fit part, and the transferred object is mounted on the transfer part again with the phase angle in the rotation direction being maintained, and after the transfer part moves to the mounting position, the phase angle of the transferred object in the rotation direction remains maintained due to the fit between the first fit part and the third fit part.

A transferred object rotating device according to a fourth aspect of the present invention is the transferred object rotating device according to the first aspect, further including a second up-and-down part positioned below the transfer part in the rotating position, and being capable of being moving up to lift the transfer part in the rotating position, and an abutting part positioned above the transfer part in the rotating position, and being capable of abutting the transfer part to regulate upward movement of the transfer part lifted by the second up-and-down part. In the rotating position, the transferred object and the transfer part are lifted by upward movement of the first up-and-down part and the second up-and-down part, and after the abutting part abuts the second up-and-down part, only the transferred object is lifted by upward movement of the first up-and-down part.

A transferred object rotating device according to a fifth aspect of the present invention is the transferred object rotating device according to the first aspect, further including a third up-and-down part positioned below the transfer part in the mounting position, and being capable of moving up to pass through the opening of the transfer part in the mounting position. In the mounting position, the transferred object is lifted away from a surface of the transfer part by upward movement of the third up-and-down part.

According to the present invention, a transferred object rotating device capable of performing operation of transferring a transferred object from a mounting position to a rotating position by a transfer part after the transferred object is mounted on the transfer part in the mounting position, and operation of rotating the transferred object in the rotating position can be obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a plan view showing a part of a transfer unit used in the transferred object rotating device according to the first embodiment, and a transferred object transferred by the transferred object rotating device.

FIG. 3 is a cross-sectional view showing a state where the transferred object has been mounted on the transfer unit in a mounting position, in the transferred object rotating device according to the first embodiment.

DESCRIPTION OF THE PREFERRED EMBODIMENTS

Figure 1:
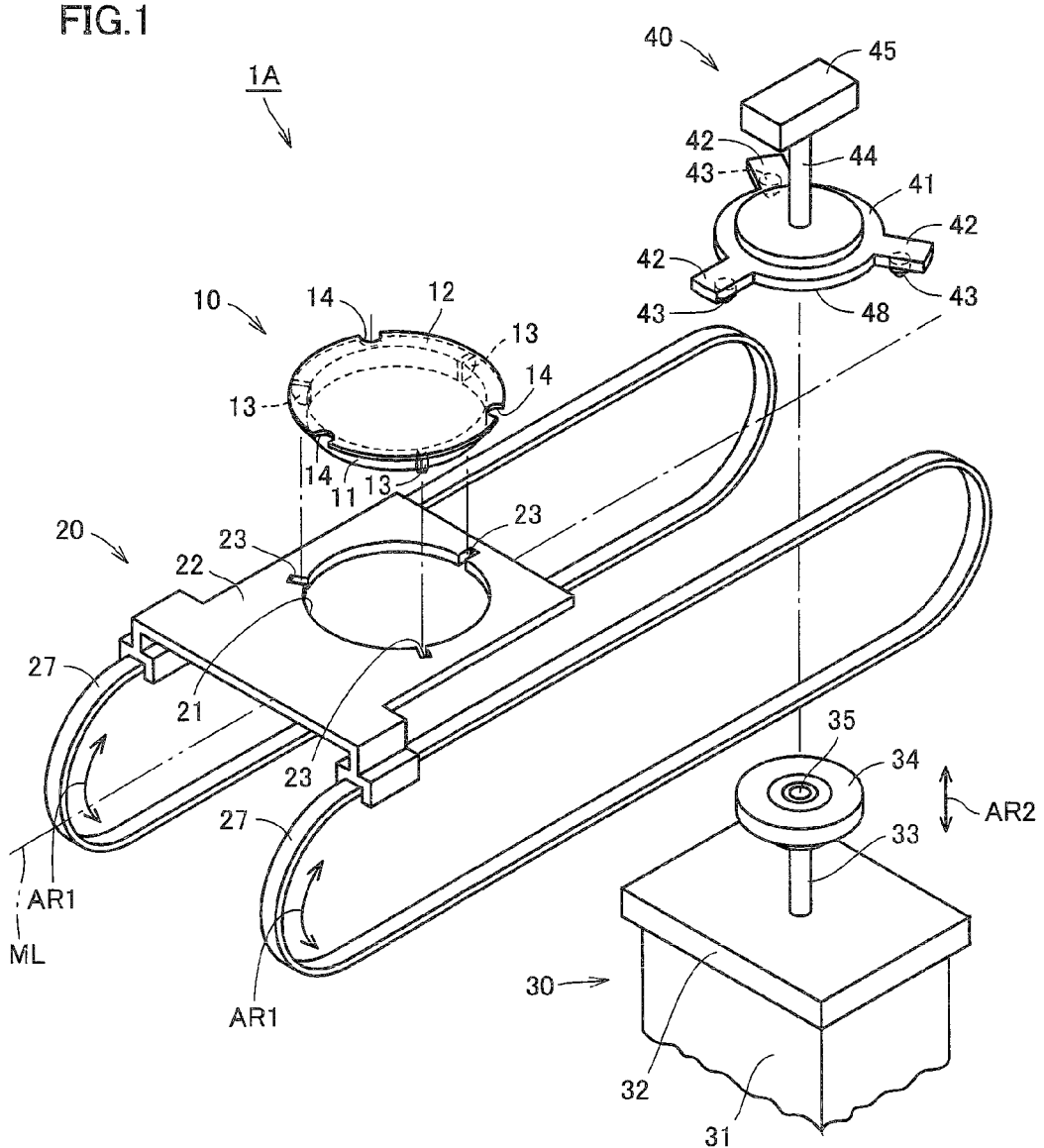
FIG. 1 is a perspective view showing a transferred object rotating device according to a first embodiment.

A transferred object rotating device according to each embodiment of the present invention will be hereinafter described with reference to the drawings. In the following description, when a number, an amount or the like is mentioned, the scope of the present invention is not necessarily limited to the number, the amount or the like, unless otherwise specified. In the following description, the same reference numerals denote the same or corresponding components, and overlapping description may not be repeated. Unless otherwise indicated, it is intended from the beginning to combine and use constructions described in the following embodiments as appropriate.

[First Embodiment]

Referring to FIGS. 1 to 6, a transferred object rotating device 1A according to the present embodiment will be described. As shown in FIG. 1, transferred object rotating device 1A for transferring and rotating a transferred object 10 includes a transfer unit 20, an up-and-down unit 30, and a rotation unit 40.

(Transferred Object 10)

Transferred object 10 includes a cylindrical portion 11 and a disk portion 12 (see also FIGS. 2 and 3). Cylindrical portion 11 is provided in a lower surface in a center of disk portion 12. Disk portion 12 is constructed with a diameter larger than that of cylindrical portion 11. An outer circumferential portion of disk portion 12 projects like a flange with respect to cylindrical portion 11.

Three projections 13 (first fit part) are provided radially outward on an outer circumferential surface of cylindrical portion 11. Projections 13 are arranged at intervals (e.g., 120°) in a circumferential direction, and each projection 13 is formed to be smaller than a shape of each recess 23 of transfer unit 20 to be described later, so as to be able to fit into each recess 23. Positions of projections 13 correspond to positions of recesses 23. As will be described later in detail, each projection 13 fits into each recess 23 with transferred object 10 being mounted on a mounting plate 22 of transfer unit 20. As a result of the fit, movement of transferred object 10 in a rotation direction with respect to mounting plate 22 (a direction of an arrow AR3 in FIG. 2) is restricted.

Three recesses 14 (second fit part) are provided radially inward in an outer edge of disk portion 12. Recesses 14 are arranged at intervals (e.g., 120°) in the circumferential direction, and each recess 14 is formed to be larger than a shape of each projection 43 of rotation unit 40 to be described later, so as to be able to fit each projection 43. Positions of recesses 14 correspond to positions of projections 43. As will be described later in detail, each recess 14 fits each projection 43 with transferred object 10 being sandwiched between rotation unit 40 and up-and-down unit 30. As a result of the fit, movement of transferred object 10 in the rotation direction with respect to a rotation plate 41 of rotation unit 40 is restricted.

A broken condition and the like of the outer circumferential surface of cylindrical portion 11 of transferred object 10 may be inspected. If an information medium such as an RFID tag is attached to the outer circumferential surface of cylindrical portion 11, the information medium may be read. A sample or the like to be centrifugally separated may be filled in cylindrical portion 11.

(Transfer Unit 20)

Transfer Unit 20 includes mounting plate 22 (transfer part) and transfer belts 27. Mounting plate 22 is supported above as a bridge by transfer belts 27 which are arranged to face each other. When transfer belts 27 rotate in a direction of an arrow AR1, mounting plate 22 reciprocates between a mounting position and a rotating position along a transfer height ML (transfer path).

The mounting position is a position apart from rotation unit 40 and up-and-down unit 30, where transferred object 10 can be mounted on transfer unit 20 (see FIGS. 1 and 3). The rotating position is a position between rotation unit 40 and up-and-down unit 30, where transferred object 10 is rotated while being sandwiched between them (see FIGS. 4 to 6). Both the mounting position and the rotating position are defined with respect to a plane direction.

Mounting plate 22 has an opening 21, which is formed to have a circular shape to conform to the shape of transferred object 10. Opening 21 has a diameter larger than that of cylindrical portion 11 and smaller than that of disk portion 12. When transferred object 10 is mounted on mounting plate 22 to close opening 21, cylindrical portion 11 fits into opening 21, and disk portion 12 abuts a surface of mounting plate 22.

Three recesses 23 (third fit part) are provided partially in an inner circumferential surface forming opening 21. Each recess 23 is larger than each projection 13. Each projection 13 fits into each recess 23 with transferred object 10 being mounted on mounting plate 22. As a result of the fit, movement of transferred object 10 in the rotation direction with respect to transfer unit 20 (the direction indicated with arrow AR3) is restricted.

(Up-and-Down Unit 30)

Up-and-down unit 30 is positioned below mounting plate 22 in the rotating position (see FIG. 4). Up-and-down unit 30 includes an up-and-down drive part 31, a pedestal part 32, a rotation support shaft 33, a boost part 34 (first up-and-down part), and a bearing 35.

Up-and-down drive part 31 below pedestal part 32 moves pedestal part 32 up and down. Rotation support shaft 33 is provided on pedestal part 32. Boost part 34 is attached to an upper end of rotation support shaft 33 with bearing 35 interposed therebetween. Bearing 35 allows boost part 34 to rotate freely (see FIG. 3). When up-and-down drive part 31 moves pedestal part 32 and rotation support shaft 33 up and down in a direction of an arrow AR2, boost part 34 also moves up and down in the same direction.

An upper surface of boost part 34 has a circular shape, which is smaller than the shape of opening 21 of transfer unit 20. When boost part 34 moves up (is lifted), boost part 34 passes through opening 21 of transfer unit 20 in the rotating position. The shape of the upper surface of boost part 34 conforms to a shape of a lower surface of cylindrical portion 11 so that transferred object 10 is lifted.

(Rotation Unit 40)

Figure 4:
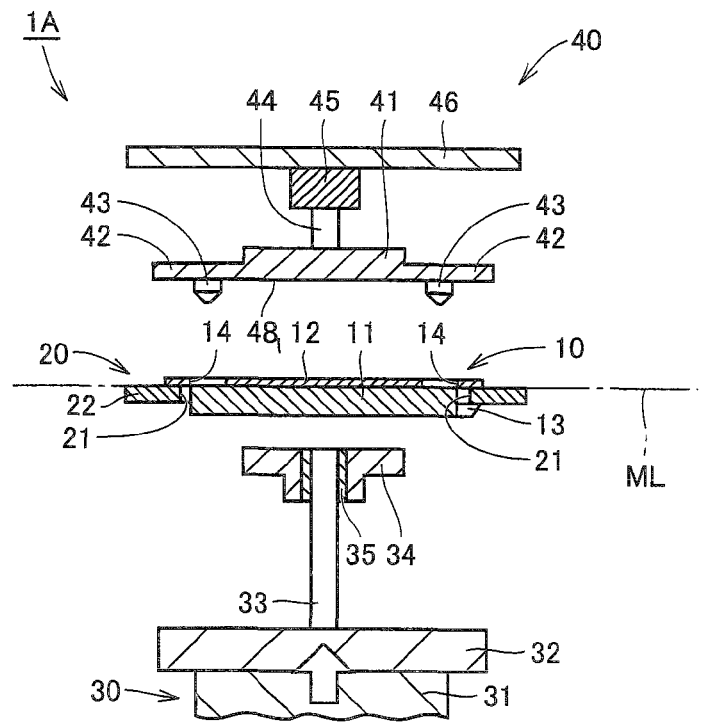
FIG. 4 is a cross-sectional view showing a state where the transfer unit having the transferred object mounted thereon has reached a rotating position, in the transferred object rotating device according to the first embodiment.

Rotation unit 40 is positioned above mounting plate 22 in the rotating position (see FIG. 4). Rotation unit 40 includes a rotation plate 41 (rotation part), extensions 42, projections 43 (fourth fit unit), a power transmission shaft 44 (rotary shaft), and a rotation drive part 45.

Rotation drive part 45 is supported by a support frame 46 (see FIG. 3). For the sake of drawing convenience, support frame 46 is not illustrated in FIG. 1. Power transmission shaft 44 is perpendicularly provided from rotation drive part 45. Rotation plate 41 is formed like a disk, with a lower end of power transmission shaft 44 being attached to the center of rotation plate 41. Three extensions 42 extend radially outward from an outer edge of rotation plate 41. Extensions 42 are spaced (e.g., 120°) in the circumferential direction. Each projection 43 is provided on a lower surface of each extension 42. Positions of projections 43 correspond to the positions of recesses 14 of transferred object 10. Rotation drive part 45 rotates projections 43 via power transmission shaft 44 and rotation plate 41.

(Operation of Transferred Object Rotating Device 1A)

FIG. 3 shows a state where transferred object 10 has been mounted on mounting plate 22 in the mounting position. In FIG. 3, up-and-down drive part 31 is in a down state (a state where pedestal part 32, rotation support shaft 33 and boost part 34 are not being boosted), and boost part 34 is positioned below transfer height ML. FIG. 4 shows a state where mounting plate 22 having transferred object 10 mounted thereon has reached the rotating position. In FIG. 4, up-and-down drive part 31 is still in a down state.

Figure 5:
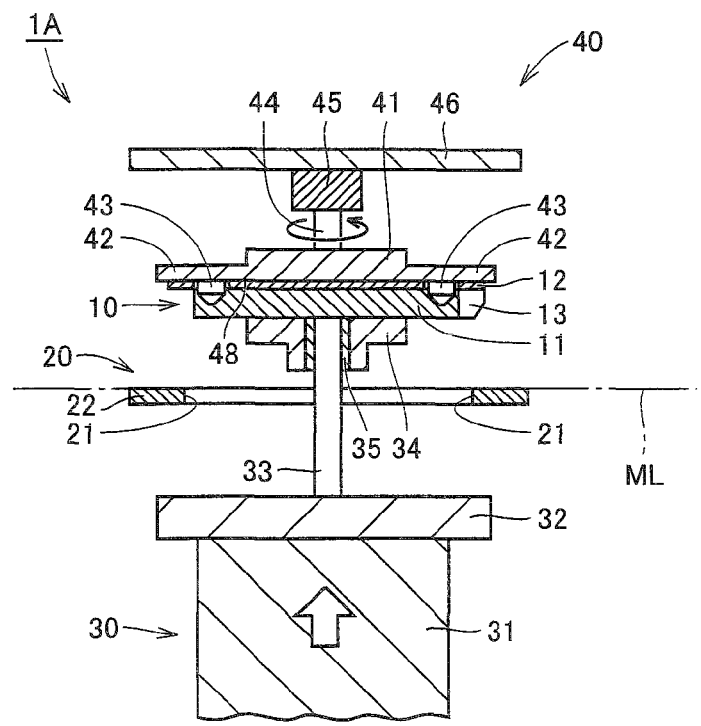
FIG. 5 is a cross-sectional view showing a state where the transferred object in the rotating position has been lifted and is rotating, in the transferred object rotating device according to the first embodiment.
Figure 6:
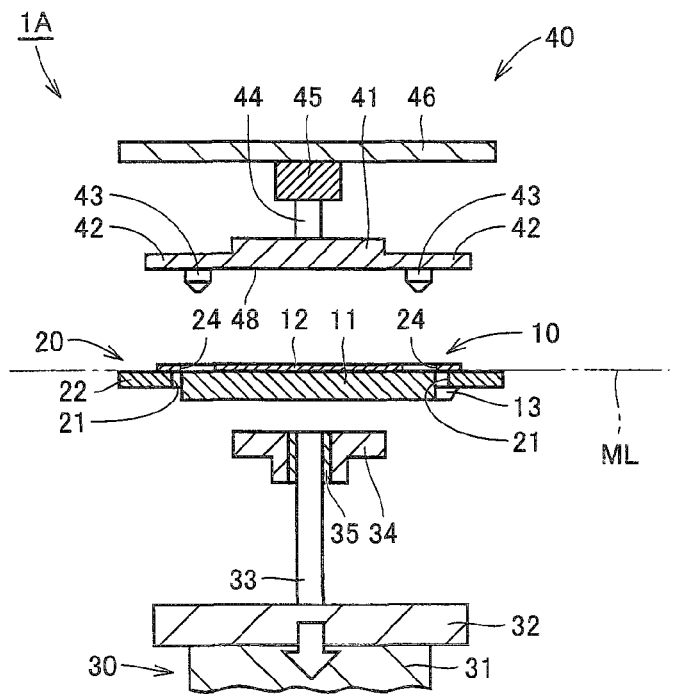
FIG. 6 is a cross-sectional view showing a state where the transferred object in the rotating position has rotated, and then moved down and has been mounted on the transfer unit again, in the transferred object rotating device according to the first embodiment.

FIG. 5 shows a state where transferred object 10 in the rotating position has been lifted and is rotating. In FIG. 5, up-and-down drive part 31 is in an up state (a state where pedestal part 32 and the like are being boosted), and boost part 34 is positioned above transfer height ML. FIG. 6 shows a state where transferred object 10 in the rotating position has rotated, and then moved down and has been mounted on mounting plate 22 again. In FIG. 6, up-and-down drive part 31 is in a down state. Transfer belts 27, 27 are not illustrated in FIGS. 3 to 6 (the same being applied to FIGS. 9 to 20 to be described later).

As shown in FIG. 3, transferred object 10 is mounted on mounting plate 22 in the mounting position. Each projection 13 fits into each recess 23. As indicated with an outline arrow, mounting plate 22 moves from the mounting position to the rotating position along transfer height ML by transfer belts 27 (see FIG. 1).

As shown in FIG. 4, mounting plate 22 stops moving in the rotating position. After the stop, up-and-down drive part 31 moves up as indicated with an outline arrow. Boost part 34 is boosted, abuts transferred object 10, and then lifts transferred object 10. Mounting plate 22 does not move from transfer height ML and remains stopped.

Boost part 34 passes through opening 21, and transferred object 10 approaches rotation plate 41. At this time, rotation plate 41 is at rest. The positions (phase angle) of projections 43 in the rotation direction are predetermined to correspond to the positions of recesses 14 of transferred object 10.

As shown in FIG. 5, transferred object 10 abuts a lower surface 48 of rotation plate 41. Each recess 14 fits each projection 43. Before and after the fit, the phase angle (angle of rotation) of transferred object 10 in the rotation direction is maintained. Specifically, after transferred object 10 moves away from mounting plate 22, transferred object 10 is lifted without rotating. Each recess 14 fits each projection 43 with the phase angle of transferred object 10 in the rotation direction being maintained.

The phase angle in the rotation direction of transferred object 10 mounted on mounting plate 22 with the predetermined positions is maintained when rotation by rotation unit 40 is started. This phase angle may be effectively utilized as position information about the rotation direction of transferred object 10, in relation to other detectors, analyzers and the like (none of them shown).

As a result of the fit between recesses 14 and projections 43, relative movement of transferred object 10 in the rotation direction with respect to rotation plate 41 is restricted. If the movement can be restricted by the fit between recesses 14 and projections 43, transferred object 10 need not abut lower surface 48.

Transferred object 10 abuts lower surface 48, and is sandwiched between boost part 34 and rotation plate 41. Rotation drive part 45 rotates rotation plate 41 in this state. Rotation plate 41 rotates transferred object 10 by a frictional force generated by abutting with transferred object 10 (or by the fit between recesses 14 and projections 43). During rotation of transferred object 10, a broken condition and the like of the outer circumferential surface of cylindrical portion 11 may be inspected, or an information medium attached to the outer circumferential surface of cylindrical portion 11 may be read. Alternatively, the sample or the like filled in cylindrical portion 11 may be centrifugally separated.

Rotation drive part 45 rotates transferred object 10 for integral time(s) (360°×n (n: integer)) at a prescribed speed. The phase angle of transferred object 10 in the rotation direction remains maintained after the rotation stops. This phase angle is effectively utilized as position information about the rotation direction of transferred object 10 in subsequent process steps (such as another analysis or another measurement).

After transferred object 10 stops rotating, up-and-down drive part 31 moves down, as indicated with an outline arrow in FIG. 6. The position of boost part 34 is also lowered, and transferred object 10 moves away from lower surface 48. The position of transferred object 10 continues to be lowered, and transferred object 10 is mounted on mounting plate 22 at transfer height ML. Each projection 13 fits into each recess 23. As a result of the fit, the phase angle of transferred object 10 in the rotation direction remains maintained.

The position of boost part 34 is further lowered, and boost part 34 moves away from transferred object 10 (the state shown in FIG. 6). Then, mounting plate 22 moves from the rotating position to the mounting position (or another prescribed position) by transfer belts 27.

(Function and Effect)

Transferred object rotating device 1A is capable of performing operation of transferring transferred object 10 from the mounting position to the rotating position by mounting plate 22 after transferred object 10 is mounted on mounting plate 22 in the mounting position, and operation of rotating transferred object 10 in the rotating position.

Transferred object rotating device 1A is suitably used for inspecting the outer circumferential surface of cylindrical portion 11 of transferred object 10, reading an information medium attached to the outer circumferential surface of cylindrical portion 11 of transferred object 10, or centrifuging the sample or the like filled in cylindrical portion 11 of transferred object 10, for example.

The phase angle in the rotation direction of transferred object 10 mounted on mounting plate 22 with the predetermined positions in the mounting position remains maintained after transferred object 10 has rotated in the rotating position and been mounted on mounting plate 22 again. This maintained phase angle is effectively utilized as position information about the rotation direction of transferred object 10, in relation to other detectors, analyzers and the like.

In the first embodiment described above, three recesses 14 of transferred object 10 and three projections 43 of rotation unit 40 are provided. Any number of recesses 14 and projections 43 may be provided as long as fit can be achieved between them, and their numbers may not be the same. The same applies to projections 13 of transferred object 10 and recesses 23 of transfer unit 20.

[Another Embodiment of First Embodiment]

If the phase angle of transferred object 10 in the rotation direction is not maintained, projections 13 and recesses 23 may not be provided. Again in this case, operation of transferring transferred object 10 from the mounting position to the rotating position by mounting plate 22 after transferred object 10 is mounted on mounting plate 22 in the mounting position, and operation of rotating transferred object 10 in the rotating position can be performed.

If the phase angle of transferred object 10 in the rotation direction is not maintained, recesses 14 and projections 43 may not be provided. In this case, transferred object 10 is sandwiched and supported between boost part 34 and rotation plate 41. Due to a frictional force generated by this sandwiching support, rotative power from rotation drive part 45 is transmitted to transferred object 10. Again in this case, operation of transferring transferred object 10 from the mounting position to the rotating position by mounting plate 22 after transferred object 10 is mounted on mounting plate 22 in the mounting position, and operation of rotating transferred object 10 in the rotating position can be performed.

Alternatively, rotation drive part 45 may rotate transferred object 10 for non-integral time(s). In this case, each projection 13 is constructed to be able to fit into each recess 23 when boost part 34 moves down. If projections 13 and recesses 23 are arranged at intervals of 120°, for example, rotation unit 40 may rotate transferred object 10 by 120°×n (n: integer). If projections 13 and recesses 23 are not provided, transferred object 10 is mounted on mounting plate 22 to close opening 21 regardless of the number of rotations of transferred object 10.

[Yet Another Embodiment of First Embodiment]

Figure 7:
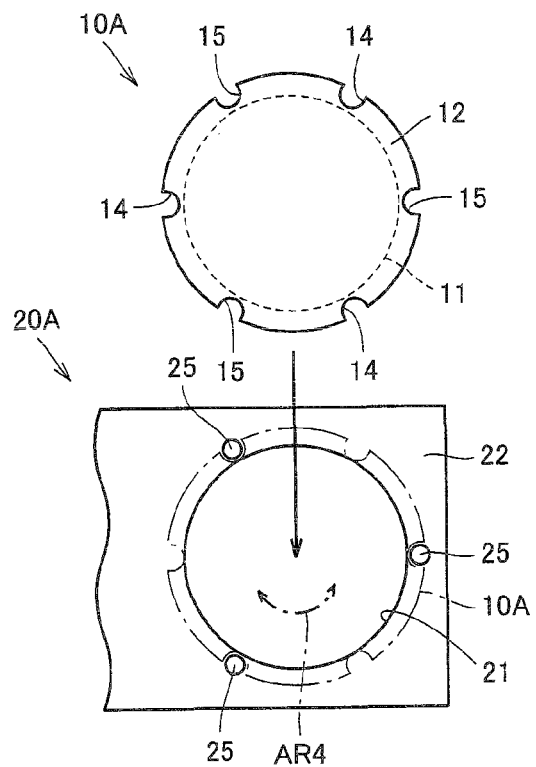
FIG. 7 is a plan view showing a part of a transfer unit used in a transferred object rotating device according to yet another embodiment of the first embodiment, and a transferred object transferred by the transferred object rotating device.

Referring to FIG. 7, recesses 15 may be provided in a transferred object 10A instead of projections 13 described above, and projections 25 may be provided on mounting plate 22 of a transfer unit 20A instead of recesses 23 described above. When transferred object 10A is mounted on mounting plate 22, each recess 15 fits each projection 25. As a result of the fit, movement of transferred object 10A in a rotation direction with respect to mounting plate 22 (a direction of an arrow AR4 in FIG. 7) may be restricted. Any number of recesses 15 and projections 25 may be provided as long as fit can be achieved between them, and their numbers may not be the same.

[Second Embodiment]

Figure 8:
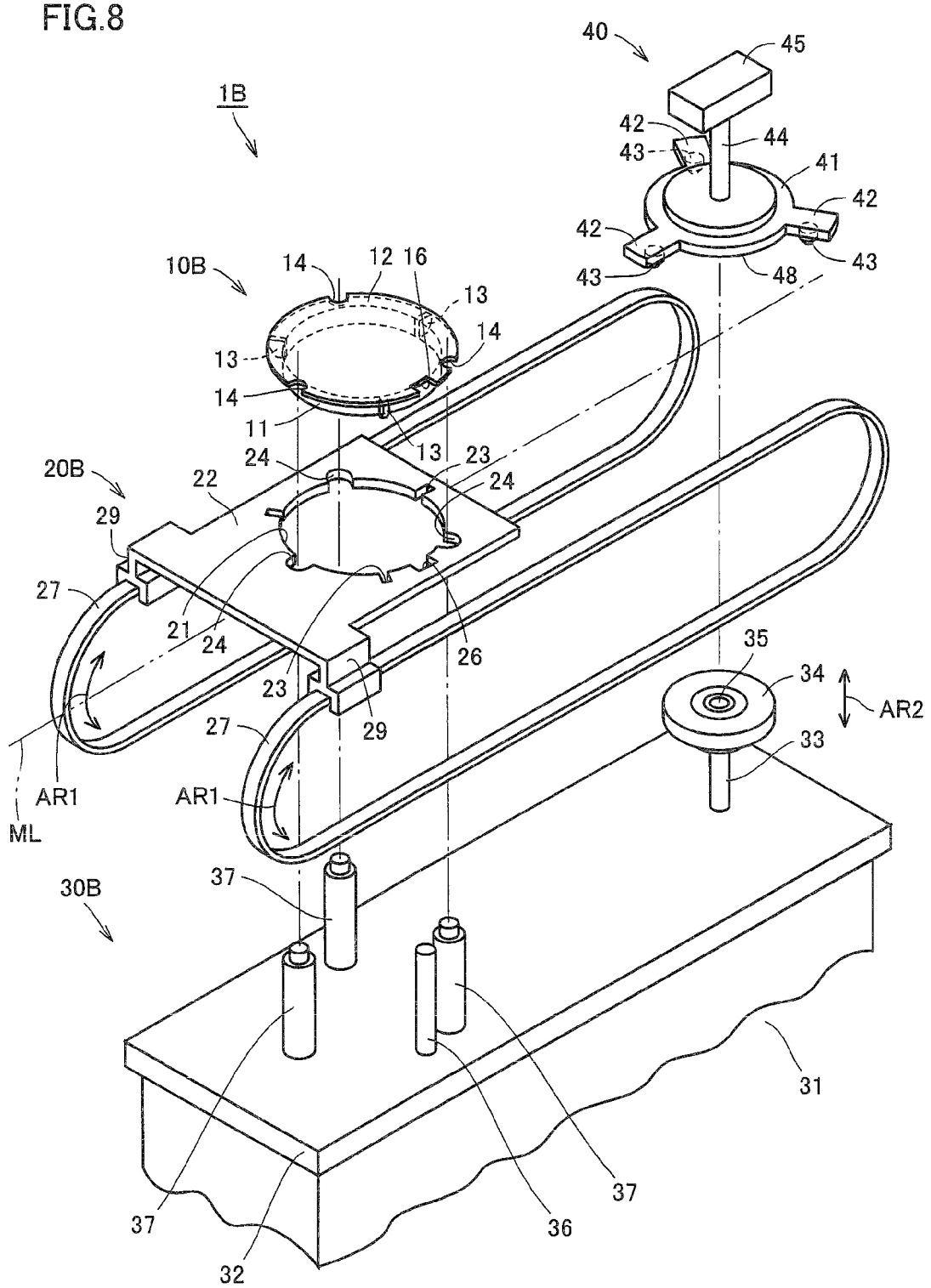
FIG. 8 is a perspective view showing a transferred object rotating device according to a second embodiment.

Referring to FIGS. 8 to 13, a transferred object rotating device 1B according to the present embodiment will be described in terms of differences from the first embodiment described above. FIG. 8 is a perspective view showing transferred object rotating device 1B. Transferred object rotating device 1B for transferring and rotating a transferred object 10B includes a transfer unit 20B, an up-and-down unit 30B, and rotation unit 40. Rotation unit 40 is constructed in a manner similar to that of the first embodiment.

Transferred object 10B is different from transferred object 10 in the first embodiment in that transferred object 10B includes a recess 16. Recess 16 is provided in the outer edge of disk portion 12. Recess 16 has a shape larger than a (two-dimensional) shape of a restricting member 36 to be described later, so as to fit restricting member 36. A position of recess 16 corresponds to a position of restricting member 36.

Transfer unit 20B is different from transfer unit 20 in the first embodiment in that mounting plate 22 of transfer unit 20B includes a recess 26 and three recesses 24. Recess 26 and recesses 24 are provided partially in the inner circumferential surface of mounting plate 22 forming opening 21.

Recess 26 has a shape larger than a (two-dimensional) shape of restricting member 36, so as to fit restricting member 36. A position of recess 26 corresponds to the position of restricting member 36 and the position of recess 16 of transferred object 10B. Each recess 24 has a shape larger than a (two-dimensional) shape of each boost member 37, so as to fit each boost member 37. Positions of recesses 24 correspond to positions of boost members 37 and the positions of recesses 14 of transferred object 10B.

Up-and-down unit 30B is different from up-and-down unit 30 in the first embodiment in that up-and-down unit 30B includes restricting member 36 and three boost members 37 (third up-and-down unit).

Restricting member 36 and boost members 37 are provided on pedestal part 32, and positioned below mounting plate 22 in the mounting position (when up-and-down drive part 31 is in a down state). Each of restricting member 36 and boost members 37 is formed like a rod, with a tip of each boost member 37 being constructed with a diameter smaller than that of its lower end side. Each of the tips can fit into each recess 14 of transferred object 10B. As a result of the fit, transferred object 10B is mounted on the tips of boost members 37. When up-and-down drive part 31 moves pedestal part 32 up and down in the direction of arrow AR2, restricting member 36 and boost members 37 also move up and down in the same direction.

(Operation of Transferred Object Rotating Device 1B)

Figure 9:
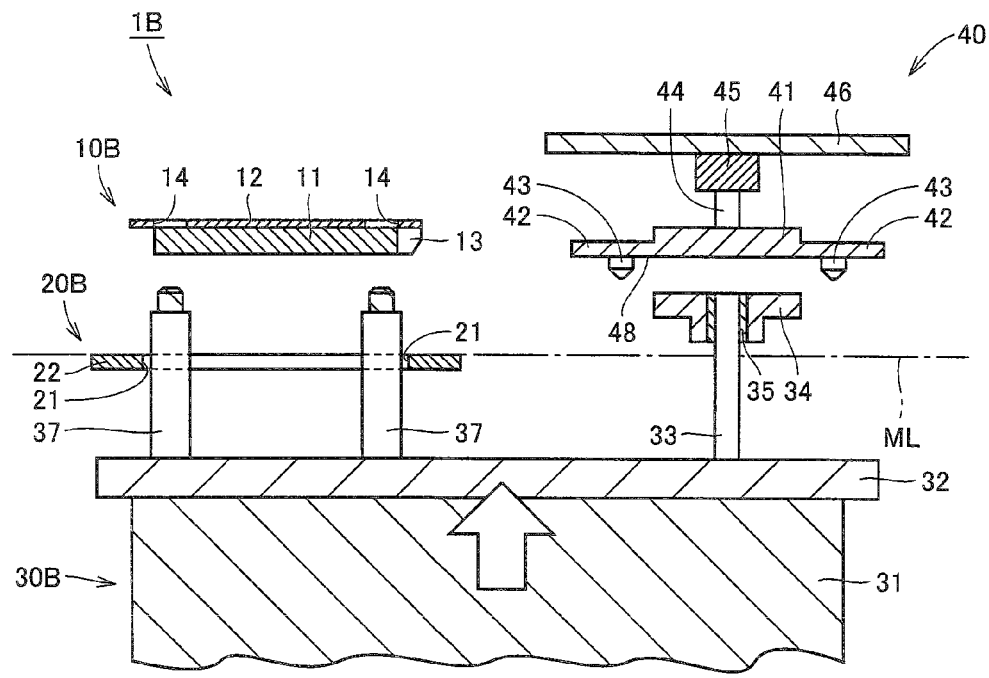
FIG. 9 is a cross-sectional view showing a state where a transferred object is mounted on boost members when a mounting plate is in a mounting position, in the transferred object rotating device according to the second embodiment.
Figure 10:
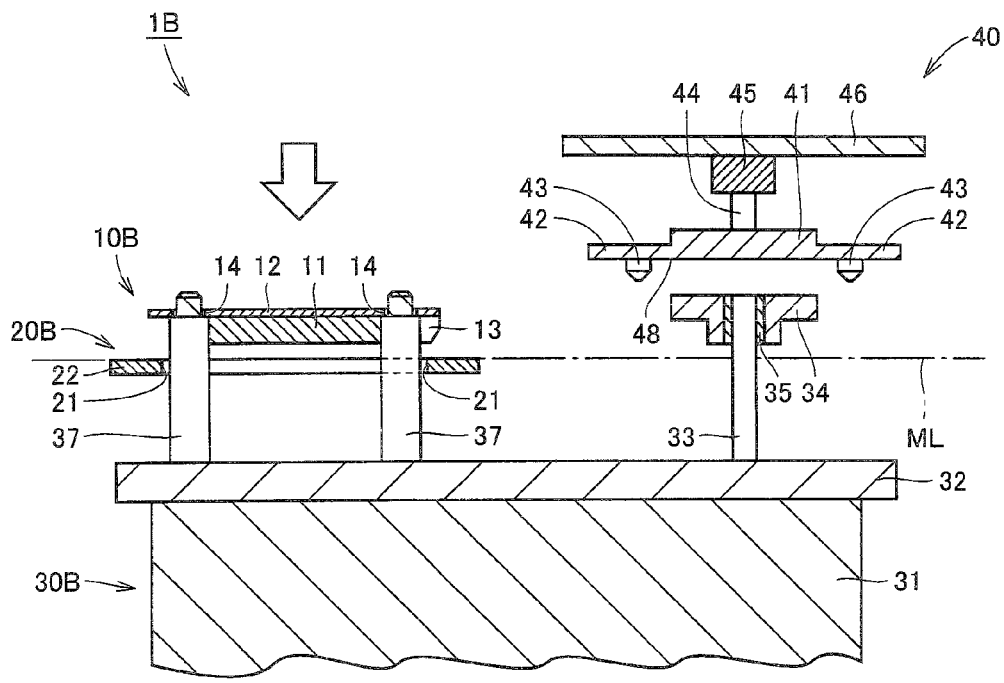
FIG. 10 is a cross-sectional view showing a state where the transferred object has been mounted on the boost members when the mounting plate is in the mounting position, in the transferred object rotating device according to the second embodiment.
Figure 11:
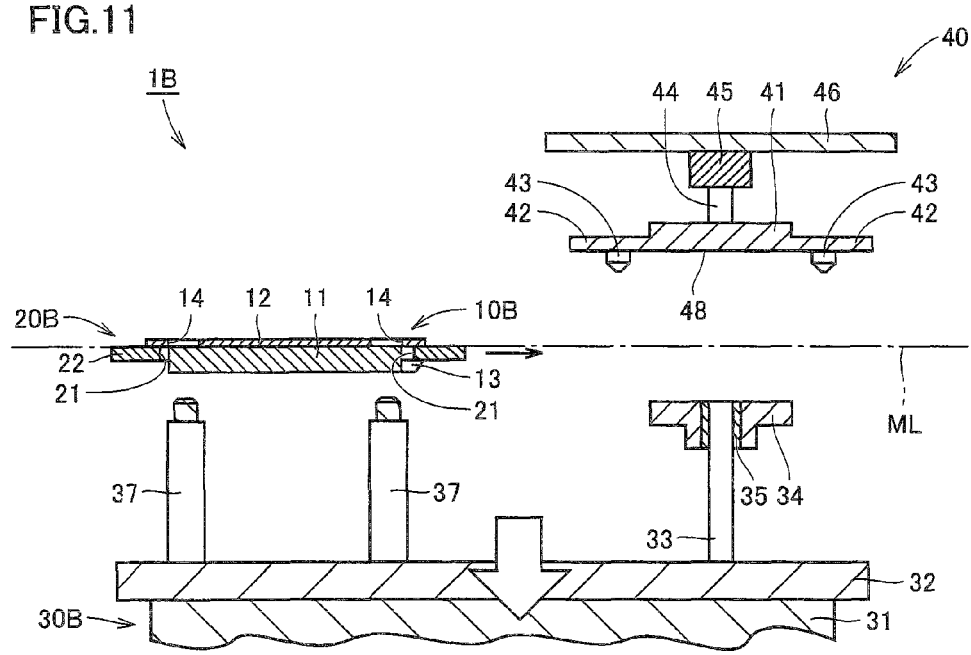
FIG. 11 is a cross-sectional view showing a state where the transferred object has been mounted on the mounting plate in the mounting position, in the transferred object rotating device according to the second embodiment.

FIG. 9 shows a state where transferred object 10B is mounted on boost members 37 when mounting plate 22 is in the mounting position. In FIG. 9, up-and-down drive part 31 is in an up state (the state where pedestal part 32 and the like are being boosted), and the tips of boost members 37 and restricting member 36 are positioned above transfer height ML. FIG. 10 shows a state where transferred object 10B has been mounted on boost members 37 when mounting plate 22 is in the mounting position. In FIG. 10, up-and-down drive part 31 is still in an up state. FIG. 11 shows a state where transferred object 10B has been mounted on mounting plate 22 in the mounting position.

Figure 12:
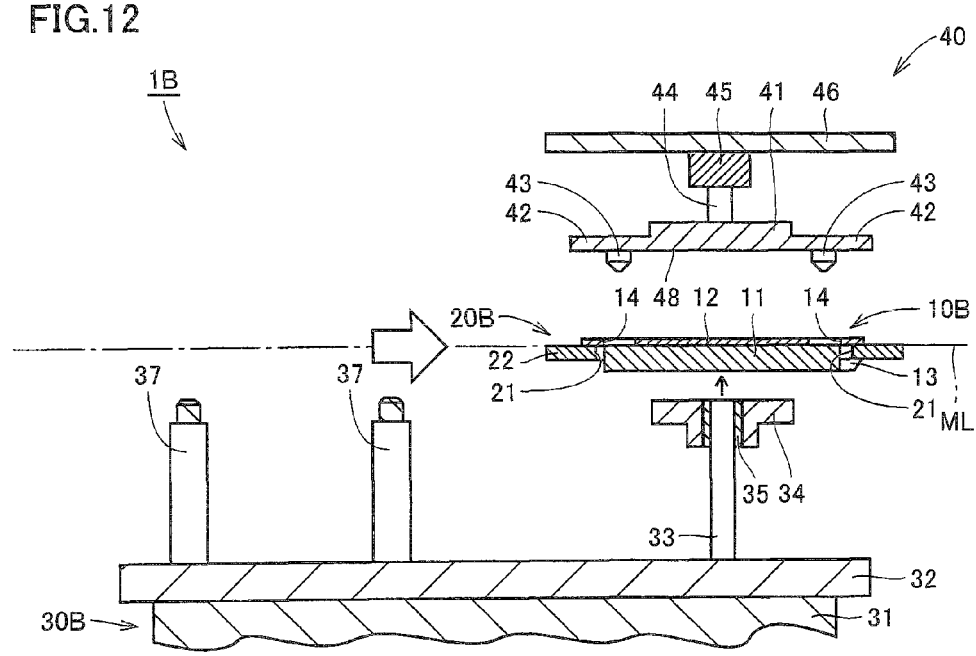
FIG. 12 is a cross-sectional view showing a state where the mounting plate having the transferred object mounted thereon has reached a rotating position, in the transferred object rotating device according to the second embodiment.
Figure 13:
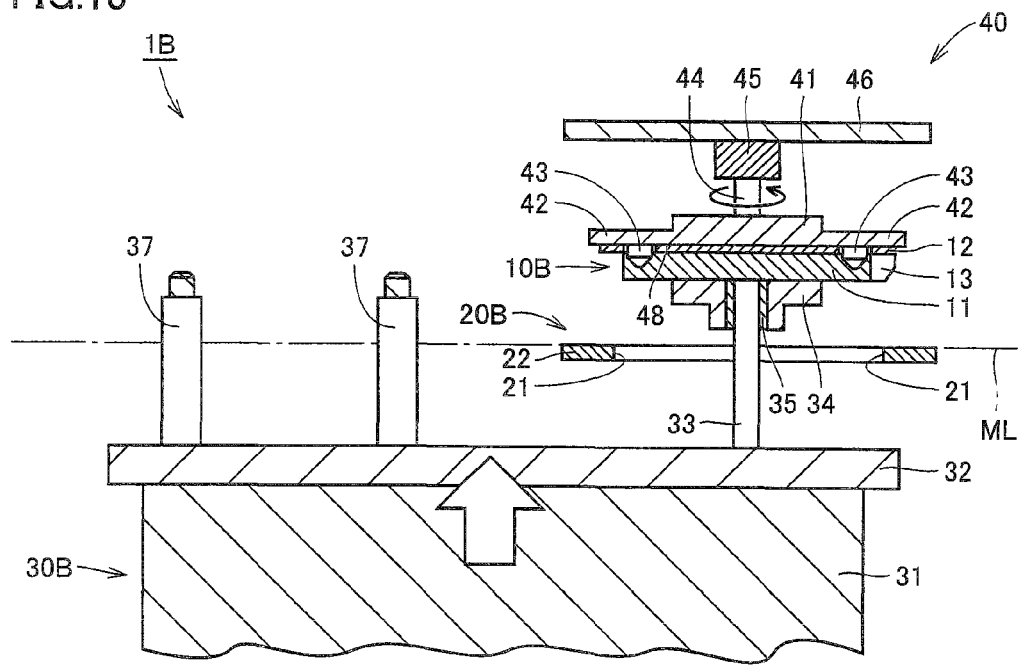
FIG. 13 is a cross-sectional view showing a state where the transferred object in the rotating position has been lifted and is rotating, in the transferred object rotating device according to the second embodiment.

In FIG. 11, up-and-down drive part 31 is in a down state (the state where pedestal part 32 and the like are not being boosted), and the tips of boost members 37 (and restricting member 36) are positioned below transfer height ML. FIG. 12 shows a state where mounting plate 22 having transferred object 10B mounted thereon has reached the rotating position. In FIG. 12, up-and-down drive part 31 is still in a down state. FIG. 13 shows a state where transferred object 10B in the rotating position has been lifted and is rotating. In FIG. 13, up-and-down drive part 31 is in an up state, and boost part 34 is positioned above transfer height ML.

As shown in FIG. 9, mounting plate 22 is in the mounting position. Boost members 37 and restricting member 36 (see FIG. 8) have been boosted by up-and-down drive part 31 (see an outline arrow in FIG. 9), and are at rest at a prescribed height. The tips of boost members 37 and the tip of restricting member 36 have passed through opening 21. Boost members 37 fit into recesses 24 (see FIG. 8), and restricting member 36 fits into recess 26 (see FIG. 8).

With boost members 37 and restricting member 36 (see FIG. 8) being boosted, transferred object 10B is mounted on boost members 37 by an operator or a machine, as indicated with an outline arrow in FIG. 10. Restricting member 36 (see FIG. 8) fits into recess 16 (see FIG. 8). As a result of the fit, a phase angle of transferred object 10B in the rotation direction is readily predetermined. During the fit, the tips of boost members 37 also fit into recesses 14 of transferred object 10B. As a result of the fit, transferred object 10B is supported above by boost members 37. Transferred object 10B moves away from mounting plate 22, and floats with respect to mounting plate 22 (a state shown in FIG. 10).

After transferred object 10B is mounted on boost members 37, up-and-down drive part 31 moves down (starts a transition to a down state), as indicated with an outline arrow in FIG. 11. The positions of pedestal part 32, restricting member 36 and boost members 37 are lowered. As the positions of boost members 37 are lowered, the position of transferred object 10B is also lowered. Transferred object 10B continues to be lowered, and is mounted on mounting plate 22 in the mounting position (a state shown in FIG. 11).

After the mounting, mounting plate 22 moves from the mounting position to the rotating position, as indicated with an outline arrow in FIG. 12. Mounting plate 22 stops moving in the rotating position (a state shown in FIG. 12). After mounting plate 22 stops moving, up-and-down drive part 31 moves up (starts a transition to an up state), as indicated with an outline arrow in FIG. 13. Boost part 34 is boosted by up-and-down drive part 31, and abuts transferred object 10B. Boost part 34 passes through opening 21 of mounting plate 22, and lifts transferred object 10B.

Transferred object 10B then abuts lower surface 48 of rotation plate 41, and each recess 14 fits each projection 43. Before and after the fit, the phase angle (angle of rotation) of transferred object 10B in the rotation direction is maintained. Transferred object 10B is sandwiched between boost part 34 and rotation plate 41 (a state shown in FIG. 13).

Rotation drive part 45 rotates transferred object 10B for integral time(s) in this state. The phase angle of transferred object 10B in the rotation direction remains maintained after the rotation stops. After transferred object 10B stops rotating, up-and-down drive part 31 moves down. The position of boost part 34 is lowered, and the position of transferred object 10B is also lowered. Transferred object 10B is mounted on mounting plate 22 again. Each projection 13 fits into each recess 23. As a result of the fit, the phase angle of transferred object 10B in the rotation direction remains maintained. Boost part 34 is further lowered, and moves away from transferred object 10B (a state shown in FIG. 12).

After boost part 34 moves away from transferred object 10B, mounting plate 22 having transferred object 10B mounted thereon moves from the rotating position to the mounting position (which corresponds to the state shown in FIG. 11). After mounting plate 22 reaches the mounting position, up-and-down drive part 31 moves up. Boost members 37 and restricting member 36 (see FIG. 8) are boosted, and pass through opening 21.

The tips of boost members 37 abut transferred object 10B. Boost members 37 fit into recesses 14, and restricting member 36 fits into recess 16. Transferred object 10B is lifted, stops at a prescribed height, and floats with respect to mounting plate 22 (which corresponds to the state shown in FIG. 10). As a result of the fit between boost members 37 and recesses 14 and the fit between restricting member 36 and recess 16, the phase angle (angle of rotation) of transferred object 10B in the rotation direction remains maintained.

(Function and Effect)

After returning to the mounting position from the rotating position, transferred object 10B floats by boost members 37 with respect to mounting plate 22. Since there is a gap between transferred object 10B and mounting plate 22, transferred object 10B can be readily lifted by the operator or the like. In transferred object rotating device 1B, transferred object 10B is mounted on boost members 37 such that restricting member 36 (see FIG. 8) fits into recess 16 (see FIG. 8). The phase angle of transferred object 10B in the rotation direction can be readily predetermined. Transferred object rotating device 1B has improved convenience. Restricting member 36 and recess 16 may be provided as appropriate.

[Third Embodiment]

Figure 14:
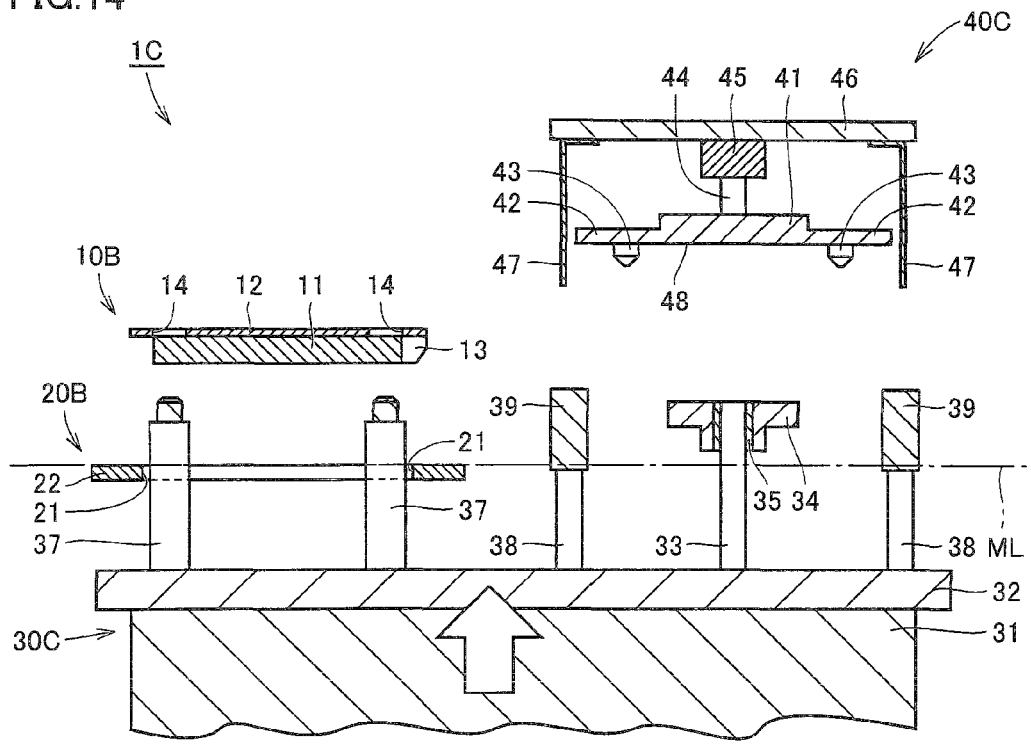
FIG. 14 is a cross-sectional view showing a state where a transferred object is mounted on boost members when a mounting plate is in a mounting position, in a transferred object rotating device according to a third embodiment.

Referring to FIGS. 14 to 18, a transferred object rotating device 1C according to the present embodiment will be described in terms of differences from the second embodiment described above. FIG. 14 is a cross-sectional view showing transferred object rotating device 1C when mounting plate 22 is in the mounting position. FIG. 14 shows a state where transferred object 10B is mounted on boost members 37, and up-and-down drive part 31 is in an up state (the state where pedestal part 32 and the like are being boosted). The tips of boost members 37 (and restricting member 36) are positioned above transfer height ML.

As shown in FIG. 14, transferred object rotating device 1C for transferring and rotating transferred object 10B includes transfer unit 20B, an up-and-down unit 30C, and a rotation unit 40C. Transferred object 10B is constructed in a manner similar to that of the second embodiment. Transfer unit 20B is different from that in the second embodiment in that mounting plate 22 is constructed to be capable of moving up and down in the rotating position. Being capable of moving up and down means that mounting plate 22 can be lifted in the rotating position by boost members 39 to be described later, and vertically displaced.

Up-and-down movement of mounting plate 22 (by boost members 39) in the rotating position can be realized by constructing portions of mounting plate 22 that are supported above as a bridge by transfer belts 27, 27 (portions indicated with sign 29 in FIG. 8) in such a manner that they can vertically extend and contract, for example. This operation will be described later in detail.

Up-and-down unit 30C is different from up-and-down unit 30B in the second embodiment in that up-and-down unit 30C further includes two support shafts 38 and two boost members 39 (second up-and-down unit). Each support shaft 38 and each boost member 39 are formed as a damper, and positioned below mounting plate 22 in the rotating position (see FIG. 15) (when up-and-down drive part 31 is in a down state). Support shafts 38 are provided on pedestal part 32 in positions apart from each other (in a horizontal direction in the plane of the drawing), with each boost member 39 being attached to an upper end of each support shaft 38. Each boost member 39 is biased upward by each support shaft 38.

Boost members 39 and support shafts 38 are positioned below a front side (the right side in the plane of FIG. 15) and a rear side (the left side in the same plane) of mounting plate 22 in the rotating position (when up-and-down drive part 31 is in a down state). When up-and-down drive part 31 moves pedestal part 32 up and down, support shafts 38 and boost members 39 are vertically moved (displaced). Boost members 39 are constructed such that their upper ends eventually abut a lower surface of mounting plate 22 when support shafts 38 and boost members 39 are lifted upward by up-and-down drive part 31 (which will be described later in detail).

Support shafts 38 and boost members 39 are constructed such that a total length (hereinafter also referred to as entire length) of support shaft 38 and boost member 39 becomes longest when an external force does not act axially (see FIGS. 14 to 16 and 18). Support shafts 38 and boost members 39 are constructed such that the entire length is shortened when an external force acts axially (see FIG. 17). A restoring force is generated within support shaft 38 and boost member 39 against the axially acting external force.

Rotation unit 40C is different from rotation unit 40 in the second embodiment in that rotation unit 40C includes two hanging members 47 (abutting part). Hanging members 47 are apart from each other and perpendicularly provided from support frame 46, and positioned above the front side and the rear side of mounting plate 22 in the rotating position. Lower ends of hanging members 47 are positioned below projections 43. Hanging members 47 are constructed such that their lower ends eventually abut an upper surface of mounting plate 22 when mounting plate 22 is lifted upward by up-and-down drive part 31 via support shafts 38 and boost members 39 (which will be described later in detail).

(Operation of Transferred Object Rotating Device 1C)

Figure 15:
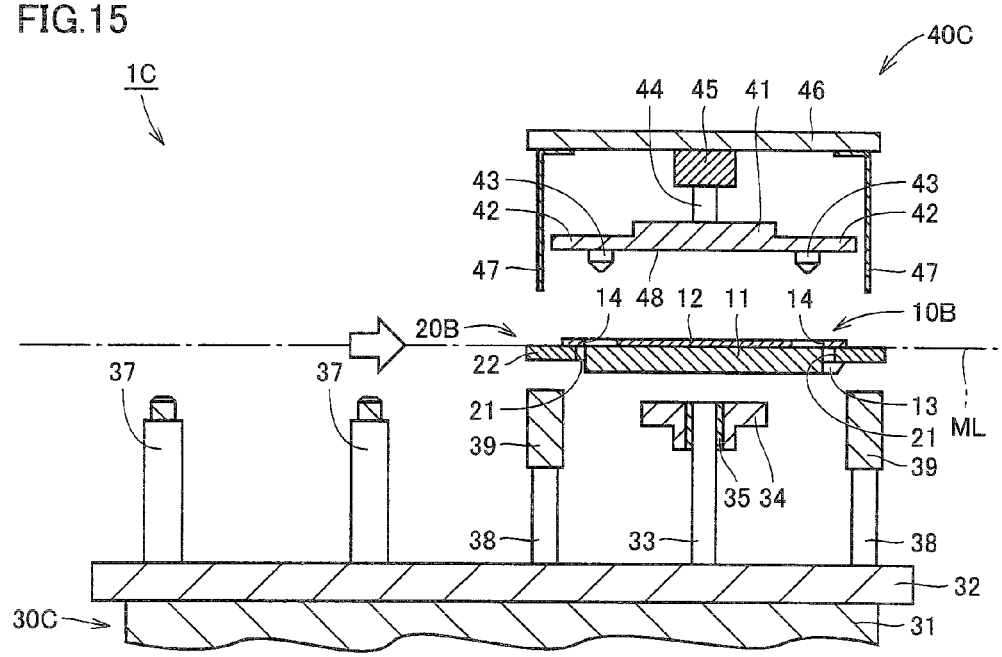
FIG. 15 is a cross-sectional view showing a state where the mounting plate having the transferred object mounted thereon has reached a rotating position, in the transferred object rotating device according to the third embodiment.

As described above, FIG. 14 shows a state where transferred object 10B is mounted on boost members 37 when mounting plate 22 is in the mounting position. In FIG. 14, up-and-down drive part 31 is in an up state (the state where pedestal part 32 and the like are being boosted), and the tips of boost members 37 (and restricting member 36) are positioned above transfer height ML. FIG. 15 shows a state where mounting plate 22 having transferred object 10B mounted thereon has reached the rotating position. In FIG. 15, up-and-down drive part 31 is in a down state.

Figure 16:
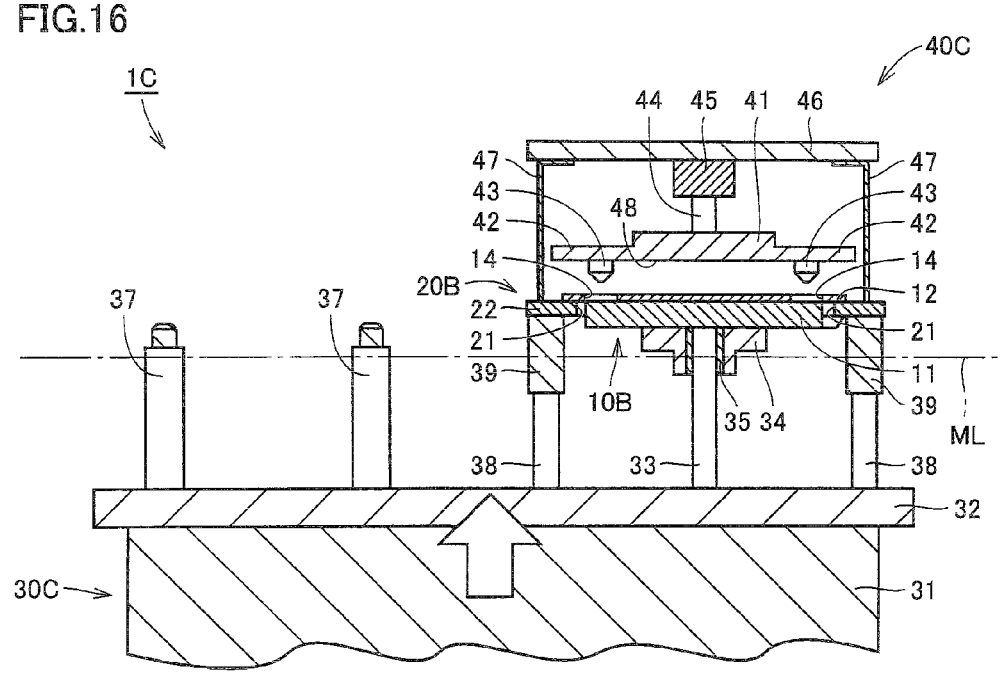
FIG. 16 is a cross-sectional view showing a state where the mounting plate in the rotating position has been lifted by upward movement of the boost members, and then abutted hanging members, in the transferred object rotating device according to the third embodiment.
Figure 17:
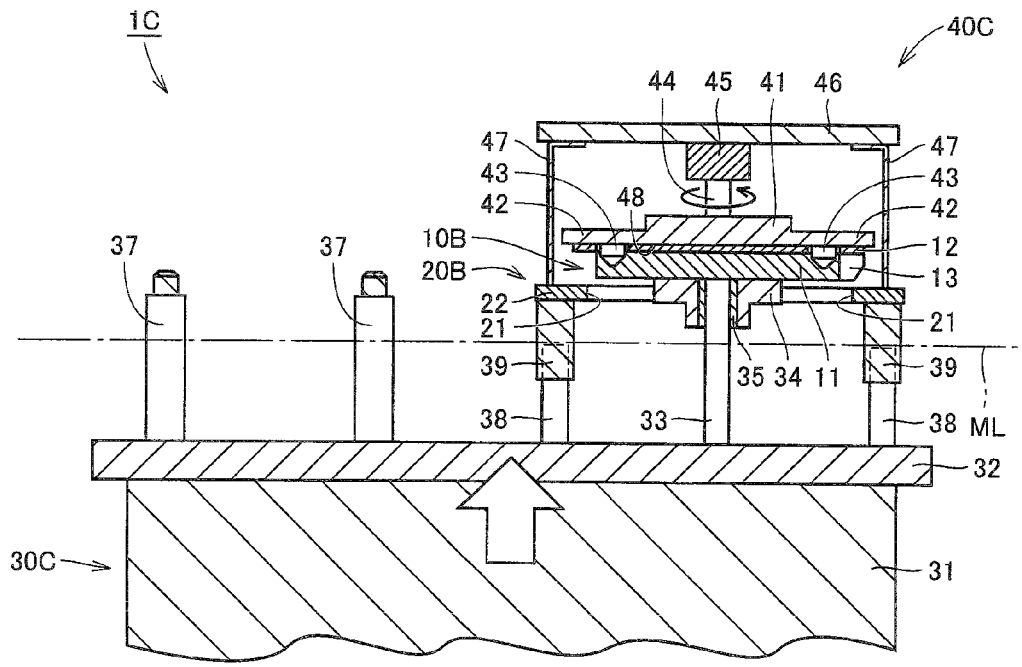
FIG. 17 is a cross-sectional view showing a state where the transferred object in the rotating position has been lifted by upward movement of a boost unit and is rotating, in the transferred object rotating device according to the third embodiment.
Figure 18:
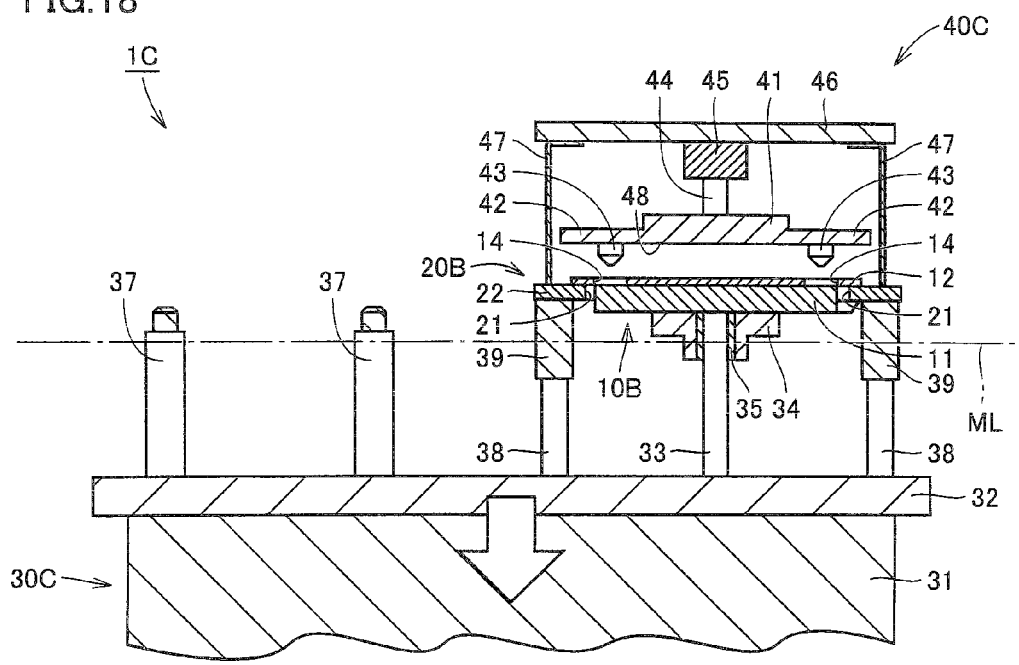
FIG. 18 is a cross-sectional view showing a state where the transferred object in the rotating position has rotated, and then has been mounted on the mounting plate again by downward movement of the boost unit, in the transferred object rotating device according to the third embodiment.

FIG. 16 shows a state where mounting plate 22 in the rotating position has been lifted by boosted boost members 39, and abutted hanging members 47. In FIG. 16, up-and-down drive part 31 is in an up state. FIG. 17 shows a state where transferred object 10B in the rotating position has been lifted by boosted boost part 34 and is rotating. In FIG. 17, up-and-down drive part 31 is still in an up state. FIG. 18 shows a state where transferred object 10B in the rotating position has rotated, and then boost part 34 has been moved (displaced) downward by downward movement of up-and-down drive part 31, causing transferred object 10B to be mounted on mounting plate 22 again. In FIG. 18, up-and-down drive part 31 is moving down (a moving-down state).

As shown in FIG. 14, mounting plate 22 is initially in the mounting position. Boost members 37 and restricting member 36 (see FIG. 8) have been boosted by up-and-down drive part 31 (see an outline arrow in FIG. 14), and are at rest at a prescribed height. The tips of boost members 37 and the tip of restricting member 36 have passed through opening 21 of mounting plate 22, and boost members 37 fit into recesses 24 (see FIG. 8) and restricting member 36 fits into recess 26 (see FIG. 8), In this state, transferred object 10B is mounted on boost members 37 by the operator or the like. Transferred object 10B is supported above by the tips of boost members 37 (which corresponds to the state shown in FIG. 10). After transferred object 10B is mounted on boost members 37, up-and-down drive part 31 moves down (starts a transition to a down state). Pedestal part 32, restricting member 36 and boost members 37 are lowered. As boost members 37 are lowered, the position of transferred object 10B is also lowered. Transferred object 10B is then mounted on mounting plate 22 (which corresponds to the state shown in FIG. 11).

After the mounting, mounting plate 22 moves from the mounting position to the rotating position, as indicated with an outline arrow in FIG. 15. Mounting plate 22 stops moving in the rotating position (a state shown in FIG. 15). After mounting plate 22 stops moving, up-and-down drive part 31 moves up (starts a transition to an up state), as indicated with an outline arrow in FIG. 16. Boost members 39 and boost part 34 are boosted by up-and-down drive part 31, and boost members 39 abut mounting plate 22. Boost part 34 may also be configured to abut transferred object 10B during the abutting.

After the upper ends of boost members 39 abut mounting plate 22, boost members 39 and boost part 34 continue to be boosted by up-and-down drive part 31. Mounting plate 22 and transferred object 10B are boosted together (with the fit between projections 13 and recesses 23 being maintained) toward rotation plate 41. Then, the surface of mounting plate 22 abuts the lower ends of hanging members 47 (a state shown in FIG. 16), and upward movement (displacement) of mounting plate 22 is restricted, causing mounting plate 22 to stop.

Due to upward movement of up-and-down drive part 31 (see an outline arrow in FIG. 17), boost part 34 continues to be boosted. Since upward movement of mounting plate 22 is restricted, the entire length of support shaft 38 and boost member 39 which are compressed is gradually reduced (see FIG. 17). Boost part 34 continues to be boosted, passes through opening 21, and abuts transferred object 10B. Transferred object 10B is lifted.

Transferred object 10B then abuts lower surface 48 of rotation plate 41. Transferred object 10B is sandwiched between boost part 34 and rotation plate 41 (a state shown in FIG. 17), and rotation drive part 45 rotates transferred object 10B for integral time(s) in this state. After transferred object 10B stops rotating, up-and-down drive part 31 moves down, as indicated with an outline arrow in FIG. 18. Boost part 34 is lowered, and transferred object 10B is mounted on mounting plate 22 again. The entire length of support shaft 38 and boost member 39 is gradually increased by the restoring force. Boost part 34 moves away from transferred object 10B, and after the entire length of support shaft 38 and boost member 39 becomes longest, boost members 39 are apart from mounting plate 22 (which corresponds to the state shown in FIG. 15).

Mounting plate 22 having transferred object 10B mounted thereon moves from the rotating position to the mounting position (which corresponds to the state shown in FIG. 14). Due to upward movement of up-and-down drive part 31, boost members 37 and restricting member 36 (see FIG. 8) are boosted to pass through opening 21. Transferred object 10B is lifted, and stops at a prescribed height. Transferred object 10B floats with respect to mounting plate 22 (which corresponds to the state shown in FIG. 10).

(Function and Effect)

When boost members 39 and boost part 34 are boosted, mounting plate 22 in the rotating position and transferred object 10B are lifted together toward rotation plate 41. The phase angle of transferred object 10B in the rotation direction can be reliably maintained by mounting plate 22, until mounting plate 22 abuts hanging members 47. Since the phase angle of transferred object 10B in the rotation direction is maintained until the vicinity of rotation plate 41, change in phase angle of transferred object 10B in the rotation direction during upward movement of transferred object 10B is sufficiently suppressed. This also applies during downward movement of transferred object 10B after the rotation of transferred object 10B.

[Another Embodiment of Third Embodiment]

Figure 19:
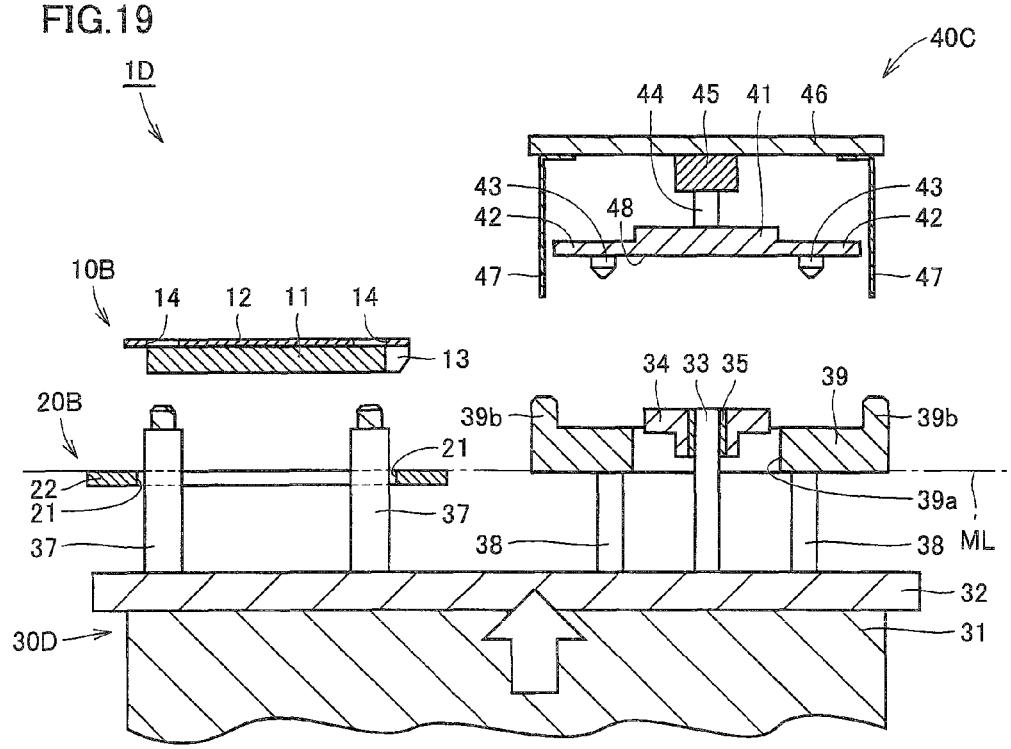
FIG. 19 is a cross-sectional view showing a state where a transferred object is mounted on a boost member when a mounting plate is in a mounting position, in a transferred object rotating device according to another embodiment of the third embodiment.
Figure 20:
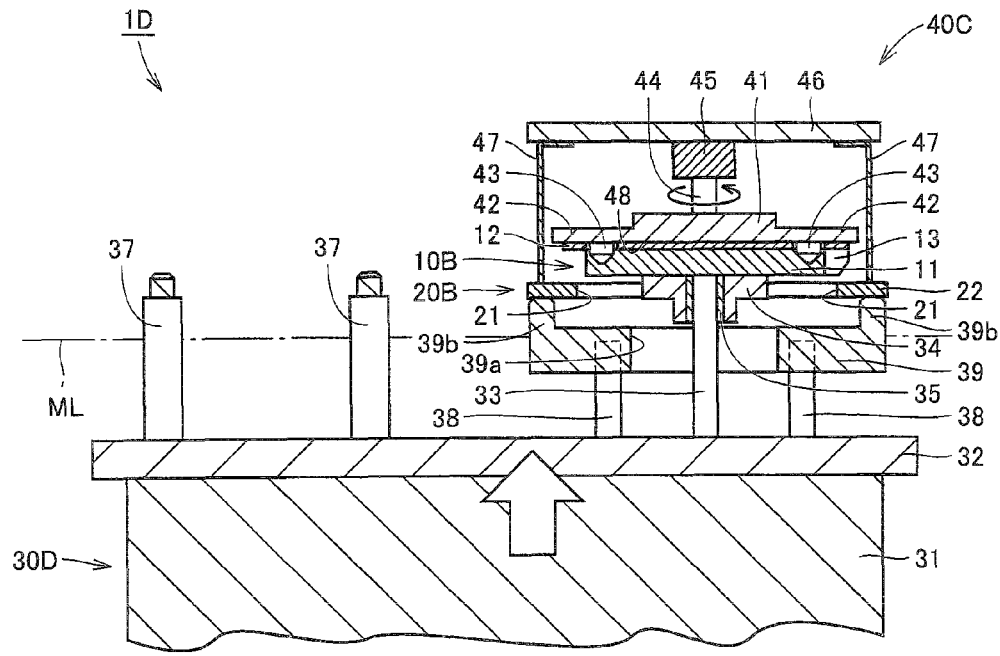
FIG. 20 is a cross-sectional view showing a state where the transferred object in a rotating position has been lifted by upward movement of a boost unit and is rotating, in the transferred object rotating device according to the another embodiment of the third embodiment.

Referring to FIGS. 19 and 20, a transferred object rotating device 1D according to another embodiment of the third embodiment will be described in terms of differences from the third embodiment described above. FIG. 19 shows a state where transferred object 10B is mounted on boost members 37 when mounting plate 22 is in the mounting position. FIG. 20 shows a state where transferred object 10B in the rotating position has been lifted by upward movement of boost members 34 and is rotating.

As an up-and-down unit 30D shown in FIG. 19, one boost member 39 may be supported above as a bridge with respect to support shafts 38, 38 which are arranged apart from each other. Boost member 39 includes an outer circumferential portion 39b provided in a position corresponding to an outer circumference of mounting plate 22. An opening 39a is provided through a central portion of a bottom surface of boost member 39, and rotation support shaft 33 and boost part 34 are arranged to pass through opening 39a.

As shown in FIG. 20, up-and-down drive part 31 can cause outer circumferential portion 39b of boost member 39 to move mounting plate 22 up in transferred object rotating device 1D as well, as in the third embodiment. The same function and effect as that of the third embodiment can be attained with transferred object rotating device 1D.

In the third embodiment and the another embodiment of the third embodiment described above, support shafts 38 and rotation support shaft 33 are provided on the same pedestal part 32. Accordingly, boost member 39 and boost part 34 are constructed to move up and down together.

If support shafts 38 and rotation support shaft 33 are provided on separate up-and-down drive units 31, and boost member 39 and boost part 34 are constructed to be able to independently move up and down, rotation unit 40C may not include hanging members 47. In this case, by moving boost member 39 up first, mounting plate 22 having transferred object 10B mounted thereon moves up toward rotation plate 41. After transferred object 10B reaches the vicinity of rotation plate 41, upward movement of boost members 39 is stopped. Then, only boost part 34 is moved up. Only transferred object 10B moves up toward rotation plate 41, and transferred object 10B can be sandwiched and supported between boost part 34 and rotation plate 41. After being sandwiched and supported, transferred object 10B can be rotated in the same manner as described above.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A transferred object rotating device for rotating a transferred object, comprising:
   a transfer part having an opening corresponding to a shape of said transferred object, and being capable of reciprocating between a mounting position and a rotating position;
   a first up-and-down part positioned below said transfer part in said rotating position, and being capable of moving up to pass through said opening of said transfer part in said rotating position; and
   a rotation part positioned above said transfer part in said rotating position, and being capable of rotating about a rotary shaft,
   said transfer part moving to said rotating position after said transferred object is mounted on said transfer part to close said opening in said mounting position,
   in said rotating position, said transferred object being lifted by upward movement of said first up-and-down part, and rotating with said first up-and-down part and said rotation part while being sandwiched between said first up-and-down part and said rotation part, and
   in said rotating position, said transferred object after the rotation moving away from said rotation part by downward movement of said first up-and-down part, said transfer part transferring said transferred object after the rotation from said rotating position to said mounting position.

2. The transferred object rotating device according to claim 1, wherein
   said transferred object includes a first fit part and a second fit part,
   said transfer part includes a third fit part capable of fitting said first fit part when said transferred object is mounted on said transfer part,
   said rotation part includes a fourth fit part capable of fitting said second fit part while sandwiching said transferred object with said first up-and-down part,
   when said transferred object is mounted on said transfer part in said mounting position, said first fit part fits said third fit part, and a phase angle of said transferred object in a rotation direction is determined, and
   when said transferred object is lifted in said rotating position, said second fit part fits said fourth fit part, and said transferred object is sandwiched between said first up-and-down part and said rotation part with the phase angle in the rotation direction being maintained.

3. The transferred object rotating device according to claim 2, wherein
   said rotation part rotates with said transferred object such that the phase angle in the rotation direction is maintained before and after the rotation,
   when said first up-and-down part moves down in said rotating position, said first fit part fits said third fit part, and said transferred object is mounted on said transfer part again with the phase angle in the rotation direction being maintained, and
   after said transfer part moves to said mounting position, the phase angle of said transferred object in the rotation direction remains maintained due to the fit between said first fit part and said third fit part.

4. The transferred object rotating device according to claim 1, further comprising:
   a second up-and-down part positioned below said transfer part in said rotating position, and being capable of moving up to lift said transfer part in said rotating position; and
   an abutting part positioned above said transfer part in said rotating position, and being capable of abutting said transfer part to regulate upward movement of said transfer part lifted by said second up-and-down part, wherein
   in said rotating position, said transferred object and said transfer part are lifted by upward movement of said first up-and-down part and said second up-and-down part, and after said abutting part abuts said second up-and-down part, only said transferred object is lifted by upward movement of said first up-and-down part.

5. The transferred object rotating device according to claim 1, further comprising another up-and-down part positioned below said transfer part in said mounting position, and being capable of moving up to pass through said opening of said transfer part in said mounting position, wherein
   in said mounting position, said transferred object is lifted away from a surface of said transfer part by upward movement of said another up-and-down part.

6. A transferred object rotating device for rotating a transferred object, comprising:
   a transfer part having an opening corresponding to a shape of said transferred object, and being capable of moving from a mounting position to a rotating position;
   a first up-and-down part positioned below said transfer part in said rotating position, and being capable of moving up to pass through said opening of said transfer part in said rotating position; and
   a rotation part positioned above said transfer part in said rotating position, and being capable of rotating about a rotary shaft,
   wherein said transfer part moving to said rotating position after said transferred object is mounted on said transfer part to close said opening in said mounting position,
   wherein, in said rotating position, said transferred object being lifted by upward movement of said first up-and-down part, and rotating with said first up-and-down part and said rotation part while being sandwiched between said first up-and-down part and said rotation part,
   wherein said transferred object includes a first fit part and a second fit part,
   said transfer part includes a third fit part capable of fitting said first fit part when said transferred object is mounted on said transfer part,
   wherein said rotation part includes a fourth fit part capable of fitting said second fit part while sandwiching said transferred object with said first up-and-down part, wherein, when said transferred object is mounted on said transfer part in said mounting position, said first fit part fits said third fit part, and a phase angle of said transferred object in a rotation direction is determined, and wherein, when said transferred object is lifted in said rotating position, said second fit part fits said fourth fit part, and said transferred object is sandwiched between said first up-and-down part and said rotation part with the phase angle in the rotation direction being maintained.

7. The transferred object rotating device according to claim 6, wherein said rotation part rotates with said transferred object such that the phase angle in the rotation direction is maintained before and after the rotation, when said first up-and-down part moves down in said rotating position, said first fit part fits said third fit part, and said transferred object is mounted on said transfer part again with the phase angle in the rotation direction being maintained, and after said transfer part moves to said mounting position, the phase angle of said transferred object in the rotation direction remains maintained due to the fit between said first fit part and said third fit part.

8. A transferred object rotating device for rotating a transferred object, comprising:

a transfer part having an opening corresponding to a shape of said transferred object, and being capable of moving from a mounting position to a rotating position;

a first up-and-down part positioned below said transfer part in said rotating position, and being capable of moving up to pass through said opening of said transfer part in said rotating position; and a rotation part positioned above said transfer part in said rotating position, and being capable of rotating about a rotary shaft, wherein said transfer part moving to said rotating position after said transferred object is mounted on said transfer part to close said opening in said mounting position, wherein, in said rotating position, said transferred object being lifted by upward movement of said first up-and-down part, and rotating with said first up-and-down part and said rotation part while being sandwiched between said first up-and-down part and said rotation part, wherein said transferred object rotating device further comprises:

a second up-and-down part positioned below said transfer part in said rotating position, and being capable of moving up to lift said transfer part in said rotating position; and an abutting part positioned above said transfer part in said rotating position, and being capable of abutting said transfer part to regulate upward movement of said transfer part lifted by said second up-and-down part, and wherein, in said rotating position, said transferred object and said transfer part are lifted by upward movement of said first up-and-down part and said second up-and-down part, and after said abutting part abuts said second up-and-down part, only said transferred object is lifted by upward movement of said first up-and-down part.

9. A transferred object rotating device for rotating a transferred object, comprising:

a transfer part having an opening corresponding to a shape of said transferred object, and being capable of moving from a mounting position to a rotating position;

a first up-and-down part positioned below said transfer part in said rotating position, and being capable of moving up to pass through said opening of said transfer part in said rotating position; and a rotation part positioned above said transfer part in said rotating position, and being capable of rotating about a rotary shaft, wherein said transfer part moving to said rotating position after said transferred object is mounted on said transfer part to close said opening in said mounting position, wherein, in said rotating position, said transferred object being lifted by upward movement of said first up-and-down part, and rotating with said first up-and-down part and said rotation part while being sandwiched between said first up-and-down part and said rotation part, wherein said transferred object rotating device further comprises another up-and-down part positioned below said transfer part in said mounting position, and being capable of moving up to pass through said opening of said transfer part in said mounting position, and wherein, in said mounting position, said transferred object is lifted away from a surface of said transfer part by upward movement of said another up-and-down part.

* * * * *